MULTIPLE RESONATOR TUNABLE MAGNETRON

Filed Sept. 15, 1954 2 Sheets-Sheet 1

INVENTOR
PAUL W. CRAPUCHETTES.
BY R. P. Morris
ATTORNEY

March 8, 1960 P. W. CRAPUCHETTES 2,928,023

MULTIPLE RESONATOR TUNABLE MAGNETRON

Filed Sept. 15, 1954 2 Sheets-Sheet 2

INVENTOR
PAUL W. CRAPUCHETTES
BY
R. P. Morris
ATTORNEY

United States Patent Office 2,928,023

Patented Mar. 8, 1960

2,928,023

MULTIPLE RESONATOR TUNABLE MAGNETRON

Paul W. Crapuchettes, Palo Alto, Calif., assignor to Charles V. Litton

Application September 15, 1954, Serial No. 456,188

11 Claims. (Cl. 315—39.61)

This invention relates to magnetron tubes, and more particularly to tunable cavity resonator magnetrons.

In tunable magnetron structures tuners have been provided in which the tuning elements, such as plungers or the like, are introduced directly into the magnetron cavity resonators for the purpose of tuning the magnetron for operation at different frequencies.

As frequency progressively increases this type of magnetron suffers from the disadvantage that the tuning range may be somewhat restricted due to the structural arrangement of the magnetron and tuning elements, particularly the clearances between vanes and tuning elements becoming impractical.

Other types of tunable magnetrons have been proposed wherein an external cavity resonator is coupled to one of a multiplicity of magnetron cavity resonators and the tuning of the whole is effected by a tuner in this coupled external resonator. Here again however, the frequency range is somewhat limited. The external resonator is generally loosely coupled with the magnetron resonators and must however depend on the intercoupling of all of the magnetron resonators with one another to effect the variation in operating frequency. Accordingly, if a very wide range is attempted the total efficiency of the magnetron may be greatly reduced because of a distortion of the fields in the interaction space and thus there is effected a limitation on the tuning range.

It is an object of this invention to provide a tunable magnetron having external tuning resonators wherein the advantage of multiple tuning may be obtained and a wider frequency tuning range achieved.

According to a feature of this invention there is provided a tunable magnetron having cavity resonator means, preferably a multiplicity of resonators, the tuning being effected by tuning a plurality of preferably symmetrically positioned external resonators coupled with the magnetron resonator means and with individual tuning elements for each of these external resonators. In the preferred form a common drive means is provided to adjust, simultaneously, the tuning devices. The principles of the invention may be applied either to the multivane type of magnetron or to the so-called interdigital or stacked interdigital type of magnetron in which a single magnetron resonator is provided.

The above-mentioned and other features and objects of this invention and the manner of attaining them will become more apparent and the invention itself will be best understood by reference to the following description of an embodiment of the invention taken in conjunction with the accompanying drawings, in which:

Fig. 1 diagrammatically illustrates a portion of a magnetron, in longitudinal cross section along the line 1—1 of Fig. 2, incorporating this invention;

Figures 1, 2:
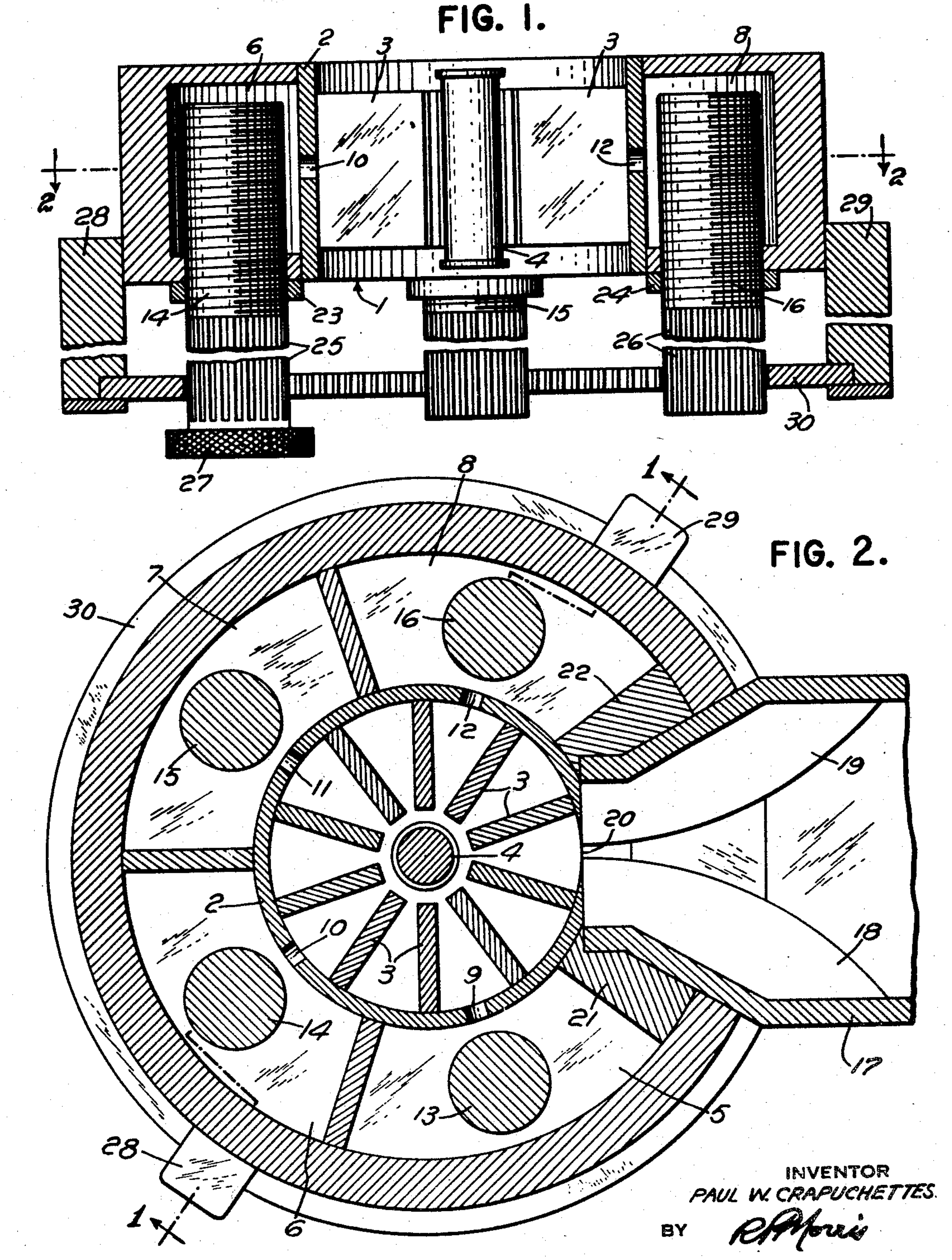
Fig. 2 is a transverse cross sectional view of the magnetron taken along the line 2—2 of Fig. 1.

Turning first to Figs. 1 and 2 of the drawing, there is shown a portion of a magnetron including the anode 1 which comprises an outer cylindrical body portion 2 and a set of vanes 3 constituting, with wall 2, an aligned multi-cavity resonator magnetron assembly. The cathode for the magnetron is indicated at 4, having an emitting portion for co-operation with the resonator defined by vane 3. The remaining portions of the envelope and magnetic circuit of the magnetron are omitted in the interest of simplicity since they are not directly related with the present invention.

Externally of magnetron body 2 are arranged a plurality of separate external resonators 5, 6, 7 and 8. As illustrated, these resonators each are substantially formed as sectors of an annulus, each sector embracing two of the sector shaped resonators of the magnetron itself. Each of the external resonators 5–8 is coupled with the corresponding pairs of magnetron resonators by communicating openings 9, 10, 11 and 12 respectively. Individual tuning means 13, 14, 15 and 16 are shown associated with external resonators 5–8. These tuning elements 13–16 comprise stubs or plungers movable longitudinally into and out of the external resonators cavities.

An output wave guide is shown at 17, Fig. 2 provided with impedance matching ramps 18 and 19 communicating through an opening 20 with one of the resonators. Blocks 21 and 22, which also serve as walls for resonators 5 and 8, serve to support wave guide 17.

The control mechanism for these tuners can best be seen by reference to Fig. 1 which illustrates the two tuners 14 and 16. It will be seen that these tuning plungers are formed of threaded rods which may be supported by collars 23, 24 and terminate in the portions 25, 26, each of which is provided with gear teeth. At the end of portions 25 is provided a knurled head 27 which may be used for adjusting the tuner. Supporting brackets 28, 29 are secured to the outer walls of resonators 6 and 8 and serve to support a ring gear 30, which meshes with the gear teeth on all the plunger extensions, such as 25 and 26. Thus by turning hand knob 27 plunger 19 may be further inserted or further retracted from resonator 6. Simultaneously, turning of the gear portion 25 turns ring gear 30 so that all of the other plungers, such as 26, are advanced into or withdrawn from the corresponding external cavity resonators. It will, therefore, be seen that as the knob 27 is turned all of these external resonators are simultaneously adjusted.

While the use of the invention has an important aspect with respect to single magnetrons as illustrated here, it should be clear that the invention is also applicable to stacked magnetrons having several one sets of vanes. Moreover, the invention is applicable to the so-called interdigital magnetrons, and to other forms of cavity resonators and tuners than those illustrated.

Figure 3:
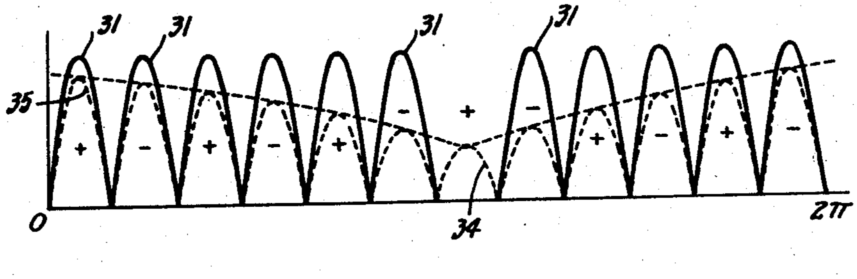
Figs. 3 and 4 are curves used in explanation of the operation of the magnetron shown in Figs. 1 and 2.
Figure 4:
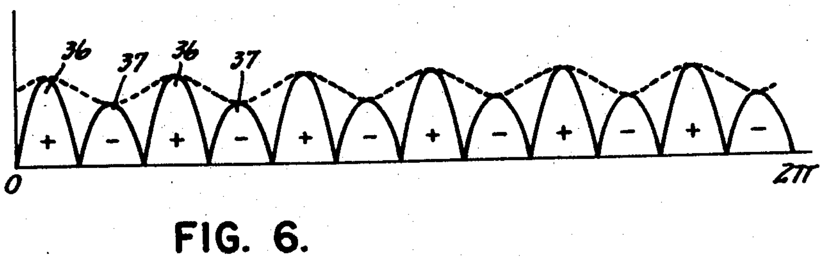

Turning now to Figs. 3 and 4, the manner in which wider tuning range may be effected while still preserving efficiency in the magnetron is illustrated. In Fig. 3 the solid line loops 31 represent the oscillations developed in the respective magnetron resonators. If a single external cavity is coupled to a resonator the particular resonator at which the coupling is made would tend to produce a loop of substantially zero amplitude. However, because of the intercoupling between the resonators of the magnetron this loop is increased in amplitude to a point as indicated at 34 and the remaining loops around the magnetron from this point assume the positions indicated by the dotted lines at 35. It is thus seen that a great variation in efficiency of operation occurs between the lowest and highest output from the magnetron resonators. In accordance with the present invention however the external resonators are coupled to only two of the adjacent magnetron resonators and the curve, therefore, will be in the form shown in Fig. 4 so that the variation in amplitude between adjacent loops is minimised as illustrated in loops 36, 37 of this curve. As a matter of fact the amplitude variation is exaggerated in Fig. 4 to show up the nature of the variation. It is, therefore, seen that a much more uniform distribution is achieved and the magnetron may be operated over a much wider tuning range without the extreme variations in output amplitude.

Studies of this type of structure indicate that the tuning range of a magnetron utilising the principles set forth above may be 100% greater than in the conventional type of tunable magnetron structure either using a single external tuning resonator or utilizing the crown of thorns type of plunger tuning. It is considered that a tuning range of 7,000–11,000 megacycles may be achieved in the frequency centering around 9,000 megacycles, for example.

Figure 5:
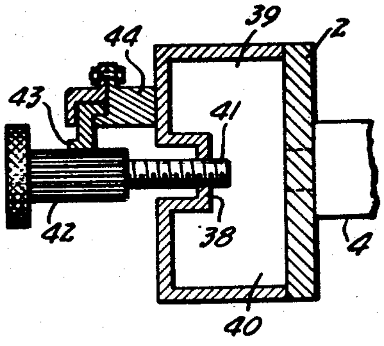
Fig. 5 is a fragmentary, longitudinal, cross-sectional view of a modified form of external resonator and tuning arrangement.

While the structure shown in Figs. 1 and 2 may operate entirely satisfactorily, it is clear that the wave guides forming resonators 5–8 are not coupled in the most efficient manner. It is generally preferable to energize or "illuminate" a wave guide resonator along the major axis of the wave guide instead of on the minor axis. However, with the type of resonators shown in Fig. 1 this may not be feasible because the vertical dimension is greater than the radial dimension. In Fig. 5 is illustrated a configuration of wave guide construction in which this difficulty may be avoided. In this figure is shown a portion of a magnetron structure similar to Fig. 1 including the wall 2 and a single set of vanes 3. However, the wave guide forming the external resonator is made with a reduced portion shown at 38. This restriction effectively provides two separate wave guides 39 and 40 coupled together through the restricted passage formed by 38. Thus the major axis of the rectangular wave guide is "illuminated" or energized. In this construction a different type of tuner is shown, the plunger 41 being threaded radially into the narrow portion 38 of the resonator wall. This plunger rod 41 may be provided at its outer end with a gear 42 which merges with a flat ring gear 43, rotatably supported in bracket 44. Thus simultaneous radial movement of plungers in all of the resonators may be accomplished in a manner similar to that described in connection with Fig. 1.

Figure 6:
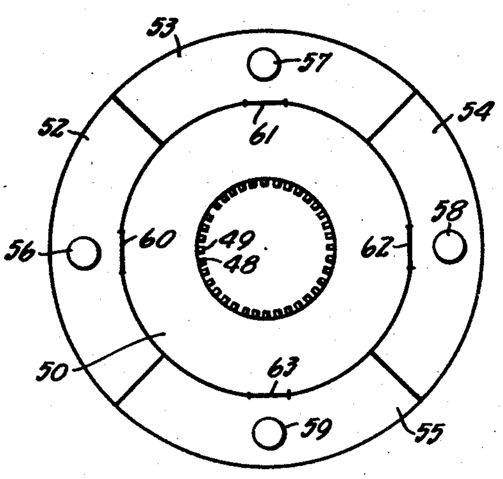
Figs. 6 and 7 are single line diagrammatic views illustrating the application of this invention to the so-called interdigital type of magnetron.
Figure 7:
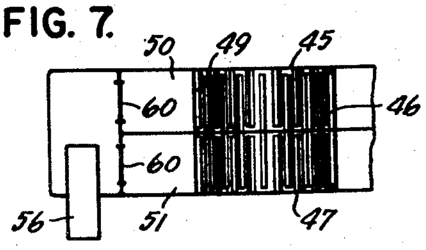

While in Figs. 1, 2 and 5 there has been illustrated the application of my invention to multi-cavity resonator magnetrons, the invention is equally applicable to the so-called inter-digital type of magnetrons. In Figs. 6 and 7 is illustrated a single line drawing exemplifying the application of this invention to that type of tube, in stacked form. The anode structure comprises two sets of plates 46, 47, plate 46 being common to 45 and 47. Between these plates are mounted spaced digits in the form of vertically extending pins or digits 48, 49. Alternate ones of these digits extend from oppositely positioned plates toward the other plates but terminate short thereof. Outside of these digits are arranged the common resonators 50, 51 corresponding to two aligned magnetron structures. External of resonators 50 and 51 are provided a plurality of separate symmetrically positioned resonators 52, 53, 54 and 55 each of which may be tuned by its respective tuning plungers 56, 57, 58 and 59. Coupling openings from the common resonators 50 and 51 are provided as shown at 60, 61, 62 and 63 communicating with the external resonators so that tuning may be effected in a manner similar to that shown in Figs. 1, 2 and 5.

It will be evident that various forms of external resonators may be provided as desired. Likewise, it is not essential that all the external resonators be contiguous one to another as illustrated. Moreover, different types of tuning units may be used instead of the plungers of the form shown. Also instead of communicating openings for coupling the magnetron resonators to the external resonators, these other types of couplings may be sealed by some insulating material so that there is no necessity of evacuating the external resonators. In fact, it is preferable that the external resonators be so associated with the structure that evacuation is not required.

While I have described above the principles of my invention in connection with specific apparatus, it is to be clearly understood that this description is made by way of example and not as a limitation to the scope of my invention as set forth in the objects thereof and in the accompanying claims.

What is claimed is:

1. A tunable magnetron having cavity resonator means of the type in which tuning is effected by tuning a resonator external of the magnetron resonator cavity means, having in combination means for effecting tuning over a wide tuning range comprising a plurality of tuning resonators each of similar dimensions, respectively, coupled to said magnetron cavity resonator means at substantially symmetrically spaced points about said cavity resonator means, adjustable means for individually tuning said tuning resonators and an output lead coupled to said cavity resonator means.

2. A magnetron according to claim 1, further comprising common drive means for simultaneously adjusting said tuning means.

3. A magnetron according to claim 1, wherein said magnetron cavity resonator means comprise a plurality of vertically aligned magnetron resonators, each of said tuning resonators comprising an elongated resonator positioned to embrace said vertically aligned magnetron resonators, and means for coupling each of said vertically aligned magnetron resonators to said tuning resonators.

4. A magnetron according to claim 3, wherein said tuning resonators are each formed with a relatively wide portion adjacent each vertically aligned magnetron resonator, and a relatively narrow portion intermediate said wide portions, substantially at the plane of said juxtaposition.

5. A tunable magnetron according to claim 1, wherein said magnetron cavity resonator means comprises a plurality of cavity resonators symmetrically positioned with respect to each other about a common center.

6. A magnetron according to claim 5, wherein said magnetron resonators are formed substantially as sectors of a cylindrical magnetron anode, and said tuning resonators are mounted circumferentially about the outer circumferential wall of said anode.

7. A magnetron according to claim 6, wherein said magnetron resonator means comprises two substantially similar, vertically juxtaposed cylindrical anodes, said tuning resonators each being positioned to embrace a vertical assembly of respective magnetron resonators, and means coupling a resonator from each said vertical row to said tuning resonator.

8. A tunable magnetron according to claim 1, wherein said magnetron cavity resonator means, comprises a single cavity resonator, and a plurality of pick-up means alternately connected to opposite sides of said single resonator.

9. A magnetron according to claim 8, wherein said resonator means further comprises two substantially similar, vertically, juxtaposed single resonator means and pick up means assemblies, said tuning resonators each being positioned to embrace said vertical assembly and means for symmetrically coupling both said single resonator means to said tuning resonators.

10. A multi-cavity resonator means of the type in which tuning is effected by a tuning resonator external of the multi-cavity resonator means, characterised by a plurality of tuning resonators respectively coupled to a plurality of the cavities of said multi-cavity resonator means, and an adjustable means for individually tuning said tuning resonators.

11. A tunable resonator means according to claim 10 wherein said multi-cavity resonators are formed substantially as sectors of a cylindrical structure and said tuning resonators are mounted circumferentially about the outer circumferential wall of said cylinder.

References Cited in the file of this patent

UNITED STATES PATENTS

| | | |
|---|---|---|
| 2,466,059 | Spencer | Apr. 5, 1949 |
| 2,473,567 | Brown | June 21, 1949 |
| 2,611,110 | Powers | Sept. 16, 1952 |
| 2,624,862 | Everhart et al. | Jan. 6, 1953 |
| 2,679,615 | Bowie | May 25, 1954 |
| 2,734,148 | Azema | Feb. 7, 1956 |
| 2,765,425 | Millman | Oct. 2, 1956 |
| 2,838,712 | Briggs | June 10, 1958 |